United States Patent [19]

Gantioler et al.

[11] Patent Number: 5,072,143
[45] Date of Patent: Dec. 10, 1991

[54] ZERO POINT DETECTOR FOR AN OPTICALLY CONTROLLABLE THYRISTOR

[76] Inventors: Josef-Matthias Gantioler, Bernheimerstr. 6; Jenoe Tihanyi, Windeckstr. 1 D, both of, 8000 Muenchen 70, Fed. Rep. of Germany

[21] Appl. No.: 550,460

[22] Filed: Jul. 10, 1990

[51] Int. Cl.[5] .................. H03K 17/72; H03K 17/78
[52] U.S. Cl. ........................... 307/643; 307/305; 307/311; 307/647; 307/354
[58] Field of Search ............ 307/305, 631, 634, 647, 307/311, 318, 643, 354

[56] References Cited

U.S. PATENT DOCUMENTS

| | | | |
|---|---|---|---|
| 4,158,150 | 6/1979 | Dever | 307/647 |
| 4,578,595 | 3/1986 | Tihanyi et al. | 307/311 |
| 4,578,596 | 3/1986 | Tihanyi et al. | 307/252 |
| 4,697,097 | 9/1987 | Rusznyak | 307/296 |

Primary Examiner—John Zazworsky
Attorney, Agent, or Firm—Hill, Van Santen, Steadman & Simpson

[57] ABSTRACT

A thyristor is controlled by a phototransistor whose photo current is reduced by a MOSFET if the thyristor voltage surpasses a prescribed value. The MOSFET is controlled by two current supplies. The first current supply is connected between a gate terminal and a connecting terminal of the thyristor. The second current supply is connected between the gate and source of the MOSFET. The maximum current capacity of the first current supply is greater than the maximum current capacity of the second current supply.

19 Claims, 1 Drawing Sheet

ZERO POINT DETECTOR FOR AN OPTICALLY CONTROLLABLE THYRISTOR

BACKGROUND OF THE INVENTION

The present invention relates to a circuit arrangement wherein the output current of a phototransistor is used to control a thyristor and wherein a MOSFET, when placed in a conductive state, reduces the base current of the phototransistor whenever the thyristor voltage surpasses a prescribed value thereby inhibiting the triggering of the thyristor.

A circuit arrangement of the aforementioned type is known as a "zero point detector". Such a circuit arrangement is frequently employed in solid-state relays. European Patent Application EP-0 144 978 B1 describes a circuit arrangement for a solid-state relay. The zero point detector disclosed therein utilizes a MOSFET that is integrated between the base contact of a phototransistor and a terminal that is at a fixed voltage potential. The gate terminal of the MOSFET is connected, via a photodiode that is pulled in the inverse direction with respect to the thyristor voltage, with another terminal at which a voltage following the thyristor voltage lies. If the voltage following the thyristor voltage exceeds a prescribed value, and if the photodiode is exposed to light, the resulting increase in the inverse current charges the gate-source capacitance of the MOSFET and places it in a conductive state. As a result, the photocurrent of the phototransistor is reduced and the thyristor cannot be placed in its conductive state despite any exposure of the phototransistor to light.

The voltage window of the above-described circuit arrangement is not safely reproducible when the circuit is constructed in an integrated form. Therefore, it is an object of the present invention to set forth a circuit arrangement of the specified type having a voltage window that may be accurately reproduced even when the circuit is constructed as an integrated circuit. Within this voltage window, the connection/activation of the thyristor is possible. Outside of this voltage window, the connection/activation of the thyristor is prevented.

SUMMARY OF THE INVENTION

A circuit arrangement for optically controlling a thyristor with a phototransistor is set forth. A control MOSFET is connected to reduce the base current at the phototransistor to prevent the phototransistor from conducting when the control MOSFET is in a conductive state. A first current source is connected between the gate of the control MOSFET and a connecting terminal of the thyristor. A second current source is connected between the gate and the source terminals of the control MOSFET. The maximum current capacity of the first current supply is greater than the maximum current capacity of the second current supply. A Zener diode is connected between the gate terminal and the source terminal of the MOSFET.

In a further embodiment of the invention, a capacitor having a capacitance greater than the gate-source capacitance of the MOSFET is placed in parallel with the Zener diode.

BRIEF DESCRIPTION OF THE DRAWINGS

Other objects and advantages of the present invention will become apparent upon reference to the accompanying description when taken in conjunction with the following drawings, on which.

DESCRIPTION OF THE PREFERRED EMBODIMENT

Figure 1:
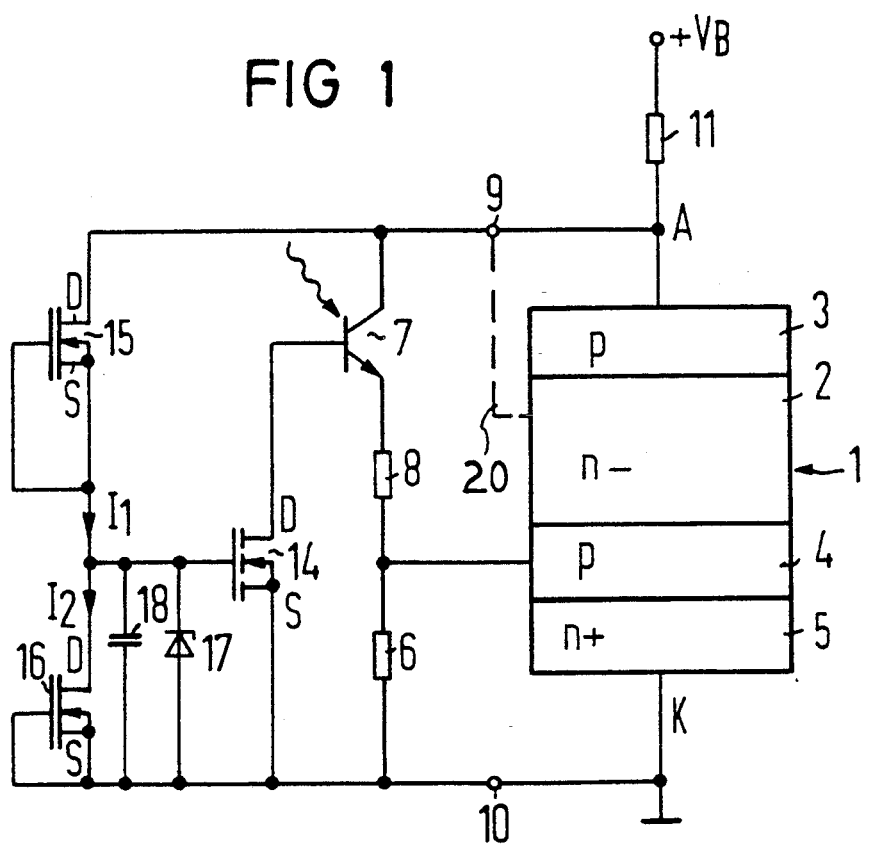
FIG. 1 is a schematic diagram of an embodiment of the present invention.

An embodiment of the present invention is shown in FIG. 1. The circuit employs a thyristor 1 having an inner zone 2, an anode zone 3, a cathode-side base zone 4 and a cathode zone 5. As is shown in the drawing, the doping proceeds from the anode A to the cathode K with a doping distribution of pn$^-$ pn$^+$. The thyristor is connected to a distribution voltage $+V_B$ at the anode A by a load resistance The cathode of the thyristor is connected to ground.

The voltage between the anode A and the cathode K of the thyristor shall be referred to as the thyristor voltage. As can be seen from the drawing, the thyristor voltage is present between two connecting terminals 9 and 10. The collector of a phototransistor 7 is connected to the anode A of the thyristor 1 at connecting terminal 9. The emitter of the phototransistor is connected to the base zone ("gate") 4 of the thyristor 1 by a resistor 8. A shunt resistance 6 is connected between the base zone 4 and the cathode zone 5 of the thyristor 1. This resistance is generally a part of the thyristor itself. The base contact of the phototransistor 7 is connected to the cathode K of the thyristor 1 via the drain-source path of an enhancement type control MOSFET 14.

A first current supply 15 is connected between the connecting terminal 9 and the gate of the control MOSFET 14. A second current supply 16 is connected between the gate and the source terminals of the control MOSFET 14. Both current supplies are preferably depletion mode MOSFETS that respectively have their gate terminals connected to their source terminals. The source terminal of the MOSFET of the first current supply 15 is connected with the drain terminal of the MOSFET of the second current supply 16. The maximum current capacity of the first current supply 15 is greater than that of the second current supply 16.

A Zener diode 17 is connected across the gate-source terminals of the control MOSFET 14. In a further embodiment of the invention, the Zener diode 17 is connected in parallel with a capacitor 18.

The operation of the circuit arrangement will now be described as the thyristor voltage increases in the positive direction from 0V. If the thyristor voltage (the voltage at the connecting terminals 9, 10) is only slightly above 0V, a relatively small current will flow from the distribution voltage $+V_B$ through the load resistance 11 and to the connecting terminal 9. The current will then pass through the first current supply 15 and the second current supply 16. If this current is less than the maximum current that is permitted by the second current supply (i.e.. $<2_{max}$), a relatively small voltage will be present between the gate and source terminals of the control MOSFET 14. This voltage will be less than the voltage required to cause the MOSFET 14 to enter a conductive state. Consequently, the control MOSFET 14 will remain in a non-conductive, open-circuited condition. When the control MOSFET 14 is non-conductive, light that impinges on the phototransistor 7 causes the phototransistor to become conductive. The resulting photocurrent triggers the thyristor 1.

Figure 2:
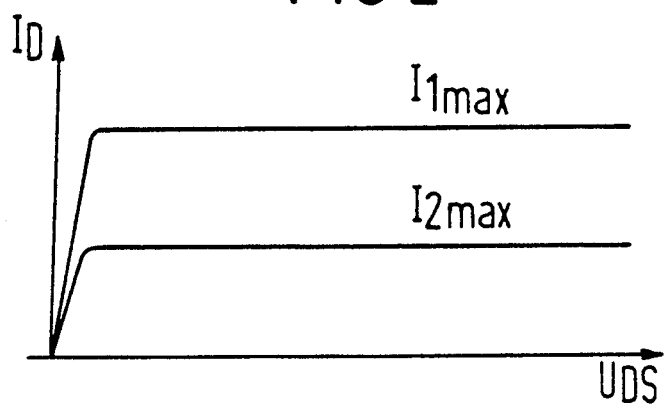
FIG. 2 is a graph showing the current/voltage characteristics of the current sources employed in an embodiment of the invention.

As the thyristor voltage continues to increase, the current $I_2$ also increases until it reaches the maximum current capacity $I_{2max}$ shown in FIG. 2. This current, for example, may be 1 µA. The gate-source voltage at the control MOSFET 14 likewise increases until its threshold voltage is reached. Once the threshold voltage is attained, the control MOSFET 14 enters a conductive state and reduces the collector-base blocking current of the phototransistor 7 to ground. With the control MOSFET 14 in its conductive state, the phototransistor 7 will be unable to trigger the thyristor 1 when the phototransistor is exposed to light since the phototransistor 7 will be unable to enter a conductive state that allows current to flow to the gate 4 of the thyristor.

As the thyristor voltage increases, so does the current $I_1$ at the first current supply 15 as well as the gate-source voltage of the control MOSFET 14. Once the Zener voltage of the Zener diode 17 is attained, the Zener diode limits the gate-source voltage of the control MOSFET 14 to a value which is sufficient to maintain the control MOSFET 14 in its conductive state. After the Zener diode 17 has experienced its breakdown, the current $I_1$ increases to the maximum current capacity $I_{1max}$ of the first current supply 15. This current, for example, may be 2 µA. As a result, the voltage across the first current supply increases. As the thyristor voltage increases further, the voltage at the first current supply 15 also increases. However, the voltage at the second current supply 16 remains constant.

Since the first current supply must be capable of accepting a high voltage (e.g., 800 V), it is constructed as a vertical depletion type MOSFET. In contrast, the second current supply 16 must merely accept a few volts. Consequently, the MOSFET of the second current supply 16 may be fashioned as a lateral depletion type MOSFET.

A capacitor 18 may be placed in parallel with the Zener diode 17. The presence of the capacitor 18 causes a time-dependent actuation of the control MOSFET 14 as opposed to a voltage-dependent actuation thereof. To ensure the time-dependence of the actuation, the capacitance of the capacitor 18 must be greater than the gate-source capacitance of the control MOSFET 14. For example, the capacitance of the capacitor 18 may be ten times higher than that of the gate-source capacitance.

When the circuit arrangement is constructed as an integrated circuit, the inner zone 2 of the thyristor 1 is generally comprised of a weakly n-doped epitaxy zone into which all of the components shown in FIG. 1 are planarly embedded. As a result, it is possible to connect the terminal 9 directly with the inner zone 2 of the thyristor, as indicated by the dashed line connection 20. As a result, a voltage following the thyristor voltage will be present at the terminal 9.

Although changes and modifications of the invention may be suggested by those skilled in the art, it is the intention of the inventors to embody within the patent warranted hereon all such changes and modifications as reasonably and properly come within the scope of the inventors' contribution to the art.

We claim as our invention:

1. A circuit arrangement for controlling a thyristor with a phototransistor whose load current provides a control current for the thyristor and wherein a control MOSFET having a gate, source and drain reduces a base current of the phototransistor to prevent the phototransistor from triggering the thyristor if a thyristor voltage between a first terminal and a second terminal of the thyristor surpasses a prescribed value, the circuit arrangement comprising:
   a first current source connected between the gate of the control MOSFET and the first terminal of the thyristor, the first current source having a maximum current capacity $I_{1max}$;
   a second current source connected between the gate and source of the control MOSFET, the second current source having a maximum current capacity $I_{2max}$, where $I_{2max}$ is less than $I_{1max}$;
   a Zener diode connected between the gate and source of the control MOSFET.

2. A circuit arrangement as recited in claim 1, further comprising a capacitor having a capacitance that is greater than the gate-source capacitance of the MOSFET connected in parallel with the Zener diode.

3. A circuit arrangement as recited in claim 1, wherein the first current source comprises a depletion type MOSFET having a gate and source that are connected to one another.

4. A circuit arrangement as recited in claim 3, wherein the depletion type MOSFET is a vertical depletion type MOSFET.

5. A circuit arrangement as recited in claim 1, wherein the second current source comprises a depletion type MOSFET having a gate and source that are connected to one another.

6. A circuit arrangement as recited in claim 5, wherein the depletion type MOSFET is a lateral depletion type MOSFET.

7. A circuit arrangement comprising:
   a thyristor having an anode, a cathode and a
   a phototransistor having a base, emitter collector, current from the emitter of the phototransistor being supplied to the gate of the thyristor the collector connected to the anode of the thyristor;
   a control MOSFET having a gate, source and d in, the drain of the control MOSFET connected to receive current from the base of the phototransistor;
   a first current source connected between gate of the control MOSFET and the anode of the , the first current source having a maximum current capacity $I_{1max}$;
   a second current source connected between the and source of the control MOSFET, the second current source having a maximum current capacity $I_{2max}$, where $I_{2max}$ is less than $I_{1max}$; and
   a Zener diode connected between the gate and source of the control MOSFET.

8. A circuit arrangement as recited in claim 7, further comprising a capacitor having a capacitance that is greater than the gate-source capacitance of the control MOSFET connected in parallel with the Zener diode.

9. A circuit arrangement as recited in claim 7, wherein the first current source comprises a depletion type MOSFET having a gate and source that are connected to one another.

10. A circuit arrangement as recited in claim 9, wherein the depletion type MOSFET is a vertical depletion type MOSFET.

11. A circuit arrangement as recited in claim 7, wherein the second current source comprises a depletion type MOSFET having a gate and source that are connected to one another.

12. A circuit arrangement as recited in claim 11, wherein the depletion MOSFET is a lateral depletion MOSFET.

13. A circuit arrangement as recited in claim 7, wherein the thyristor, the phototransistor, the control MOSFET, the first and second current sources, and the Zener diode are constructed as an integrated circuit.

14. An integrated circuit arrangement comprising:
- a thyristor having an inner zone, a cathode and a gate;
- a phototransistor having a base, emitter and collector, current from the emitter of the phototransistor being supplied to the gate of the thyristor, the collector connected to the inner zone of the thyristor;
- a control MOSFET having a gate, source and drain, the drain of the control MOSFET connected to receive current from the base of the phototransistor;
- a first current source connected between the gate of the control MOSFET and the anode of the thyristor, the first current source having a maximum current capacity $I_{1max}$;
- a second current source connected between the gate and source of the control MOSFET, the second current source having a maximum current capacity $I_{2max}$, where $I_{2max}$ is less than $I_{1max}$; and
- a Zener diode connected between the gate and source of the control MOSFET.

15. An integrated circuit arrangement as recited in claim 14, further comprising a capacitor having a capacitance that is greater than the gate-source capacitance of the control MOSFET connected in parallel with the Zener diode.

16. An integrated circuit arrangement as recited in claim 14, wherein the first current source comprises a depletion type MOSFET having a gate and source that are connected to one another.

17. An integrated circuit arrangement as recited in claim 16, wherein the depletion type MOSFET is a vertical depletion type MOSFET.

18. An integrated circuit arrangement as recited in claim 14, wherein the second current source comprises a depletion type MOSFET having a gate and source that are connected to one another.

19. An integrated circuit arrangement as recited in claim 18, wherein the depletion type MOSFET is a lateral depletion type MOSFET.

* * * * *